United States Patent [19]
Page

[11] Patent Number: 5,241,218
[45] Date of Patent: Aug. 31, 1993

[54] ARMATURE MOVEMENT DETECTION CIRCUIT

[75] Inventor: Michael Page, Staffordshire, England

[73] Assignee: Norgren Martonair Limited, Staffordshire, England

[21] Appl. No.: 833,170

[22] Filed: Feb. 10, 1992

[30] Foreign Application Priority Data

Feb. 9, 1991 [GB] United Kingdom ............... 9102789

[51] Int. Cl.$^5$ ............................................. H01H 9/00
[52] U.S. Cl. ................................ 307/104; 361/154; 361/187
[58] Field of Search ............. 361/154, 187, 155, 156, 361/94, 87, 84, 97; 307/104; 340/664, 648; 324/545; 318/266, 282

[56] References Cited

U.S. PATENT DOCUMENTS

| | | | |
|---|---|---|---|
| 3,553,571 | 1/1971 | Fendt et al. | 361/84 |
| 4,321,946 | 3/1982 | Paulos et al. | 137/554 |
| 4,886,114 | 12/1989 | Perkins et al. | 166/65 |
| 4,970,622 | 11/1990 | Buchl | 361/154 |

FOREIGN PATENT DOCUMENTS 61-061409 3/1986 Japan .
2227618 8/1990 United Kingdom .

Primary Examiner—Todd E. DeBoer
Assistant Examiner—Aditya Krishnan
Attorney, Agent, or Firm—Cushman, Darby & Cushman

[57] ABSTRACT

A solenoid valve includes a monitoring circuit adapted to sense the current drop that occurs through the solenoid coil when the solenoid armature moves correctly, sensing of the drop being used to cause a neon to glow continuously so as to indicate correct operation of the solenoid. If the drop is not sensed, the neon is caused to blink so as to indicate incorrect operation of the solenoid. The circuit may in addition or alternatively be arranged to generate a voltage signal, upon correct operation of the solenoid, for transmission to a remotely located programmable logic controller used to control operation of the valve and like valves that form part of a pneumatically controlled machine.

3 Claims, 2 Drawing Sheets

ARMATURE MOVEMENT DETECTION CIRCUIT

BACKGROUND OF THE INVENTION

1. Field of the Invention

This invention relates to a circuit for detecting the movement of a solenoid armature associated, for example, with a solenoid valve, whereby correct or incorrect operation of the armature, and therefore of the valve, may be monitored, especially from a remote location.

2. Description of the Related Art

Pneumatically operated systems, for example, typically comprise a large number of solenoid valves which function in a predetermined, desired sequence and control the operation of pneumatic devices such as cylinders. Usually, operation of the system is monitored from a remote, central console and it would be desirable to provide, as part of the console, means to indicate that each solenoid armature is operating correctly, or not, as the case may be. It is an object of the present invention to provide such means, and this object is achieved by relying on the observation that, when a solenoid armature moves in response to energisation of the solenoid coil, the inductance of the coil changes which causes the current flowing through the coil to drop momentarily.

SUMMARY OF THE INVENTION

According to one aspect of the present invention, therefore, there is provided a solenoid comprising, in combination: a solenoid coil, an armature that moves in response to energisation of the coil, first means for monitoring the current flowing through the coil during energisation thereof, second means for sensing the presence or absence of a momentary reduction in the value of said current upon energisation of the coil, and third means responsive to said second means for producing a signal indicative of the presence or absence of said reduction.

The first means preferably comprises a resistor, typically having a much lower resistance than, for example about 1% of the resistance of the coil, connected in series with the coil across which resistor a voltage drop, proportional to the coil current, is established and which is fed to the second means which preferably comprises an RC circuit the output of which is fed to a comparator circuit which forms part of the third, signal producing means.

The signal produced by the third means and which is indicative of the presence or absence of said current reduction, and therefore of correct or incorrect operation of the solenoid, may be utilised in a number of ways. For example, the signal may serve to permit or prevent, as the case may be, continuing operation of the system of which the solenoid forms a part, i.e. it may be an interlock signal. In addition or alternatively, it may serve, in conjunction with a visual or audible indicating means, to provide, possibly at a remote location, visual or audible indication of correct or incorrect operation of the solenoid.

The indicating means may, for example, comprise a light-emitting diode adapted, on the one hand, to glow continuously in the event that said current reduction has occurred (thereby indicating that the armature has moved properly) or, on the other hand, to remain unlit or to "blink" in the event that said reduction has not occurred (thereby indicating a fault).

The present invention also provides, in a second aspect, a circuit for connection to a solenoid to provide a combination as defined by the first aspect of the invention. Preferably, the circuit is embodied in a plug to which a power source is connectable and which itself is connectable to the solenoid, the power source serving to drive the solenoid and the circuit. Conveniently, the plug may be connectable, by a simple push-on connection, to the usual connecting tabs of the solenoid.

The present invention also provides, in a third aspect, a solenoid-operated fluid flow control valve including the combination as defined by the first aspect of the invention.

BRIEF DESCRIPTION OF THE DRAWINGS

The invention will now be described in more detail, by way of example only, with reference to the accompanying drawings, in which.

DETAILED DESCRIPTION OF THE PREFERRED EMBODIMENT

Figure 1:
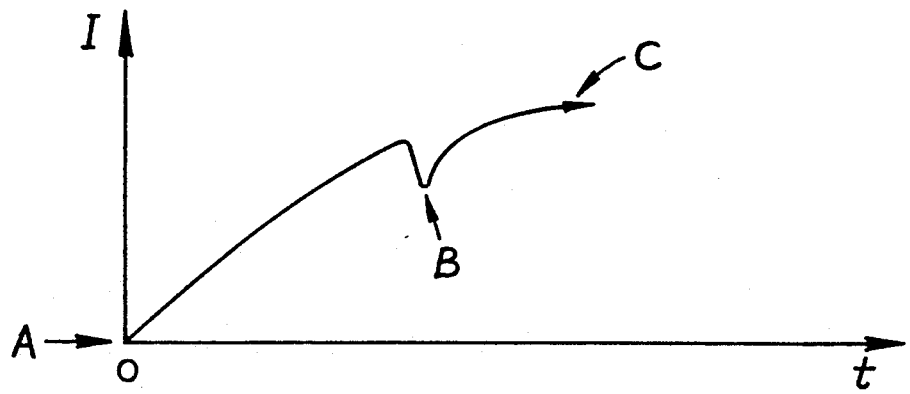
FIG. 1 is a graph showing the typical relationship between coil current and time during energisation of a solenoid coil.

Referring firstly to FIG. 1 of the drawings, this shows a typical relationship of coil current (I) to time (t) when a conventional solenoid is energised. When the current is first switched on (point A on the graph) it gradually rises until the strength of the magnetic field generated by the coil becomes sufficient to draw the armature (e.g. of soft iron) to a position within it. At this point in time, and provided that the armature moves fully, a significant change in the coil's inductance occurs, whereby the current I flowing through the coil momentarily reduces (point B on the graph). The current I then reverts to a value at, or slightly above, the armature-actuating value (this last point is C on the graph). In accordance with the present invention, that momentary reduction (or otherwise) in the current I flowing through the solenoid coil is utilised to monitor correct (or incorrect) operation of the solenoid.

Figure 2:
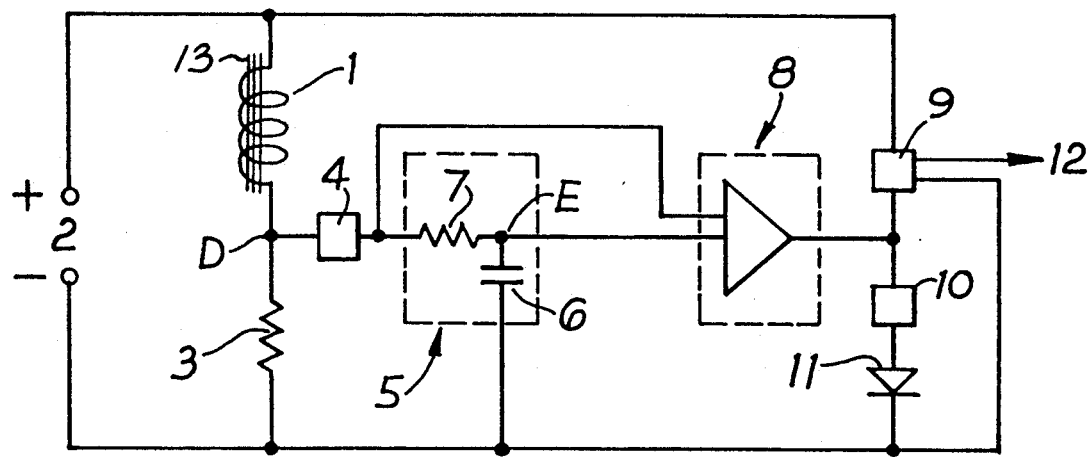
FIG. 2 is a schematic circuit diagram of one form of armature movement detection circuit according to the invention for monitoring operation of a solenoid valve.

Referring to FIG. 2, the solenoid coil 1 and its armature 13 associated with the valve (not shown) is connected to a DC control voltage source 2 (typically 12 to 24 volts generated, for example, from a remotely located programmable logic controller, not shown, used to control the system of which the valve forms a part) via a series resistor 3. The voltage drop across the resistor 3, which is proportional to the current flowing through the coil 1, is amplified by an amplifier 4 and the amplified signal is conditioned by an RC circuit 5 comprising a capacitor 6 and resistor 7. The voltage waveform at D in the circuit obviously corresponds to that shown in FIG. 1. Thus, it will be seen that, when the current I through the coil 1 momentarily reduces (point B in the graph of FIG. 1) the voltage V at E (see FIG. 2) remains constant. The difference between the voltage at E and the amplified voltage at D is sensed by a comparator circuit 8 which, via a latching circuit 9 and an oscillator 10 operating at high frequency, causes a light-emitting diode 11 to glow continuously, thereby indicating correct operation of the solenoid, until the circuit has reset after de-energisation of the coil 1. The circuit 8 also produces, in response to correct operation of the solenoid, a voltage signal 12 (see FIG. 3) that may be sent to, for example, the remotely located programmable logic controller referred to above.

In the event that the armature 13 of the solenoid coil 1 does not move fully, or at all, into the coil 1 upon energisation thereof, the aforesaid reduction in the coil current I will not occur and the voltage at E will be the same as the amplified signal at D and so the diode 11 will, by virtue of the oscillator 10 operating at a much lower frequency, flash on and off thereby indicating a fault condition, e.g. a jammed armature.

Figure 3:
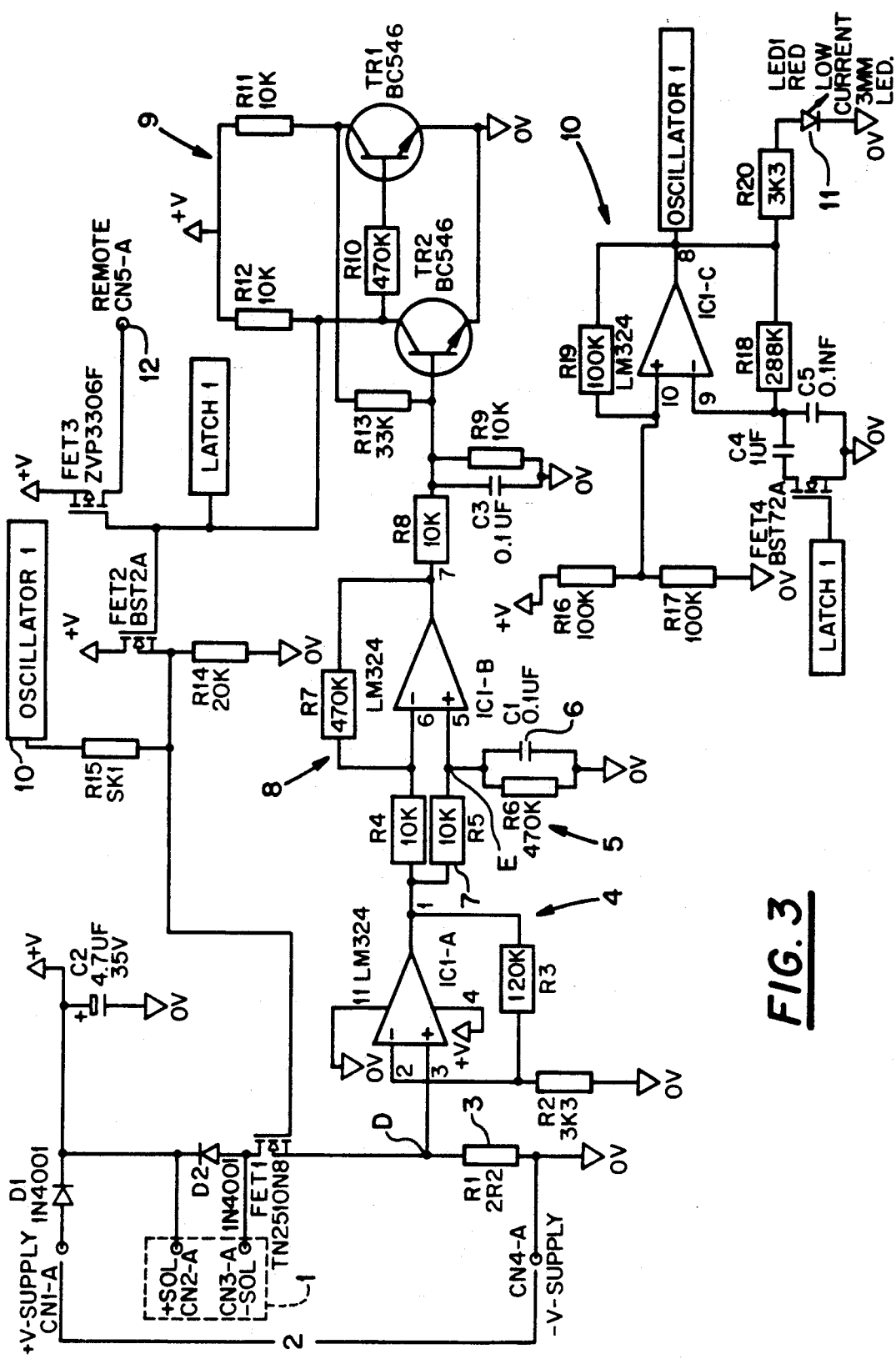
FIG. 3 is a detailed diagram of the circuit shown schematically in FIG. 2.

FIG. 3 sets out, in detail, the circuit shown in FIG. 2. The various components are denoted by their conventional symbols and their operation and function will be readily apparent to those skilled in the art. In FIG. 3, elements in the presently preferred embodiment which correspond to particular elements in FIG. 2 are labelled with like reference numerals. For example, resistor R1 in FIG. 3 (denoted by reference numeral 3) corresponds to element 3 in FIG. 2. Similarly, capacitor C1 corresponds to element 6, resistor R5 corresponds to element 7, LED1 corresponds to element 11, etc.

The light-emitting diode 11 or other indicating device may, in particular, as will be appreciated, be located remotely from the coil, for example on a remote control/monitoring console which normally will be linked up to a large number of solenoid-operated devices (which will be connected to respective detection circuits of the invention) such as pneumatic solenoid valves used to control the operation of a machine. Alternatively, for example, the light-emitting diode 11 may be located, in a visible position, on the plug referred to earlier.

I claim:

1. A circuit adapted for connection to a solenoid, said solenoid having a solenoid coil and an armature that moves upon initial energisation of the coil, said circuit comprising:

means for energising said solenoid coil by passing current therethrough;

first means for monitoring said current passing through said solenoid coil during initial energisation thereof, said first means comprising a resistor across which a voltage drop proportional to said current is established;

second means for producing a steady output voltage corresponding substantially to a peak of said voltage drop across said resistor during initial energisation of said coil, said second means comprising an RC circuit which is responsive to said voltage drop; and third means for comparing said output voltage of said second means with said voltage drop across said resistor during initial energisation of said coil and for producing differing output signals depending of whether or not a reduction in said prevailing voltage drop relative to said peak voltage drop has occurred, said differing output signals being indicative of whether or not said armature has moved correctly, said third means comprising a comparator circuit.

2. A circuit according to claim 1 further comprising a visual indicating device for indicating, in response to the output signal of the comparator circuit, the presence or absence of said reduction.

3. A circuit according to claim 2 wherein said indicating device comprises a light emitting diode.

* * * * *